(12) United States Patent
Jungroth et al.

(10) Patent No.: US 6,449,211 B1
(45) Date of Patent: Sep. 10, 2002

(54) VOLTAGE DRIVER FOR A MEMORY

(75) Inventors: Owen W. Jungroth, Sonora; Rajesh Sundaram, Fair Oaks; Mase J. Taub, Folsom; Rupinder K. Bains, Antelope; Raymond Zeng, Folsom; Binh N. Ngo, Folsom; Bharat Pathak, Folsom, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/945,021

(22) Filed: Aug. 31, 2001

(51) Int. Cl.[7] ................................................. G11C 8/00
(52) U.S. Cl. ............................ 365/230.06; 365/185.23; 365/185.08
(58) Field of Search ...................... 365/230.06, 185.23, 365/185.11, 185.08

(56) References Cited

U.S. PATENT DOCUMENTS

| 5,467,032 A | * 11/1995 | Lee ........................ 365/230.06 |
| 5,473,563 A | * 12/1995 | Suh et al. ............... 365/230.06 |
| 5,787,037 A | * 7/1998 | Amanai .................. 365/185.23 |

* cited by examiner

*Primary Examiner*—Huan Hoang
(74) *Attorney, Agent, or Firm*—Fish & Richardson P.C.

(57) ABSTRACT

A circuit includes (i) an N-channel device having a gate, a source connected to low voltage, and a drain connected to a memory select gate, (ii) a P-channel device having a gate, a source, and a drain connected to the drain of the N-channel device, and (iii) a voltage supply connected to the source of the P-channel device, the voltage supply switching between a first high voltage and a first lower voltage. A gate driver supplies, to the gates of the N-channel and P-channel devices, a second high voltage, a second low voltage, or an intermediary voltage between the second high voltage and second low voltage. The gate driver supplies the intermediary voltage when the voltage supply switches between the first high voltage and first lower voltage.

25 Claims, 3 Drawing Sheets

VOLTAGE DRIVER FOR A MEMORY

TECHNICAL FIELD

This invention relates to a voltage driver for a memory.

BACKGROUND

Voltage "snap-back" is a phenomenon that occurs when the drain voltage of an N-channel transistor is high and the gate voltage of the transistor switches from low voltage to a higher voltage. During snap-back, ionization current from the N-channel transistor flows into the transistor substrate. This causes the substrate to bias upwards, which forward biases the drain-source junction causing more current to flow through the transistor into the substrate. This positive feedback effect can destroy the transistor.

One method of eliminating snap-back includes increasing the N-channel length of the transistor. This method affects the transistors speed of operation, requiring an increase in its channel width to maintain a constant speed. Increasing the channel width, however, increases the size of the transistor. This is problematic when chip space is limited.

DESCRIPTION

Figure 1:
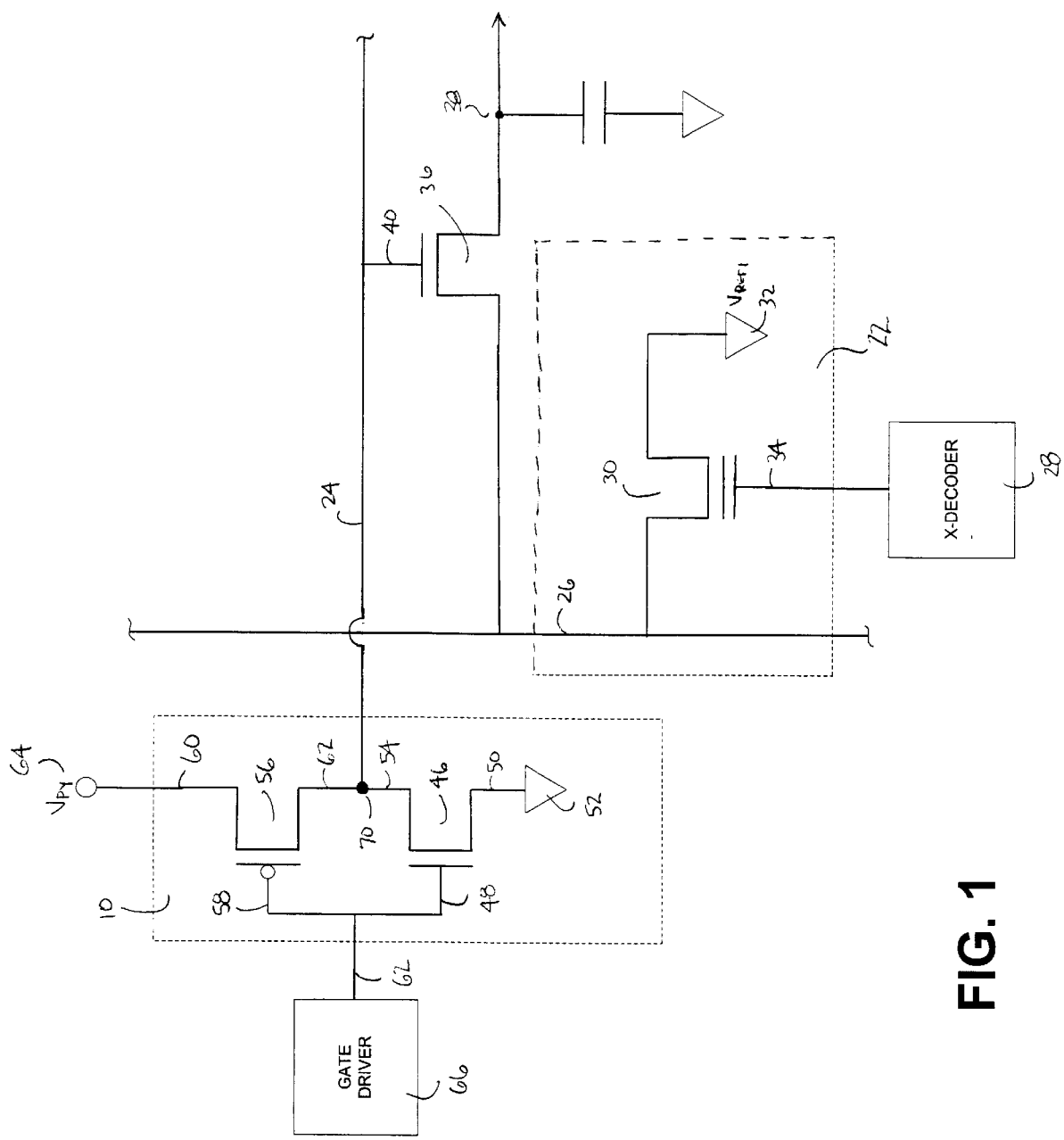
FIG. 1 is a block diagram of a flash memory circuit, which includes a Y-select driver circuit.
Figure 2:
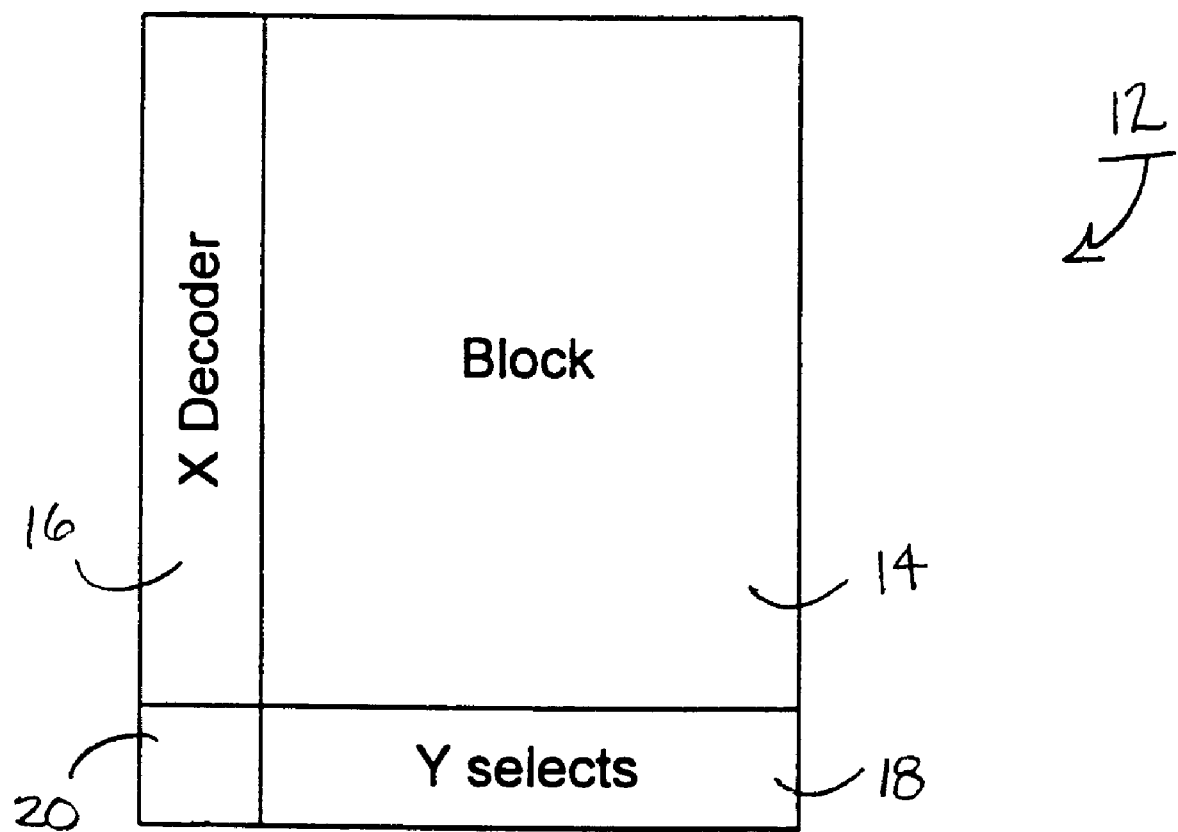
FIG. 2 shows a chip layout of the flash memory circuit.

FIG. 1 shows a circuit 10 for driving the Y-select gates of a flash memory cell. As shown in FIG. 2, a flash memory chip 12 contains many block 14's of memory cells. Each cell contains a charge storage device, such as a capacitor, for holding data. The cells are arranged in a matrix format, such that each cell in the matrix is addressable by Cartesian XY coordinates. Flash memory chip 12 thus contains an X-decoder 16 and Y-select gates 18. X-decoder 16 provides the X-coordinate of a memory cell in block 14 and Y-select gates 18 provide the Y-coordinate of a memory cell in block 14. Area 20 on flash memory 12 is reserved for other circuitry, including the Y-select driver circuit described below.

FIG. 1 also shows an example of a memory cell 22 that may be contained within block 14 and associated Y-select driver circuit 10. Memory cell 22 contains a word line 34 and a bit line 26. In this example, word line 34 corresponds to the X-coordinate and bit line 26 corresponds to the Y-coordinate. The voltage supply to word line 34 is controlled by X-decoder circuit 28 and the voltage supply to bit line 26 is controlled by Y-select driver circuit 10.

In more detail, a switch, in this case a flash cell 30, is connected between bit line 26 and an array voltage source ($V_{REF1}$) 32. To select bit line 26, Y-select driver circuit 10 provides a voltage to gate 40 of transistor 36. This voltage turns transistor 36 on, thereby causing transistor 36 to act as a short circuit. The voltage from array source 32 is provided to bit line 26 through flash cell 30. To de-select bit line 26, Y-select driver circuit 10 removes the voltage from (or lowers the voltage to) gate 40 of transistor 36.

Y-select driver circuit 10 controls the voltage on Y-select line 24. A switch, in this case a transistor 36, is connected between bit line 26 and a sense node 38. To program or read data to/from memory cell 22, Y-select driver circuit 10 supplies a voltage to Y-select line 24. This voltage is transferred to the gate 40 of transistor 36, causing transistor 36 to turn on. Transistor 36 then behaves as a closed circuit allowing current to flow through sense node 38 to read data or to program flash memory cell 22.

Although only one memory cell 22 is shown in FIG. 1, there are numerous such cells in block 14 of flash memory 12 (FIG. 1). Control circuitry (not shown) controls which bit lines and/or word lines in block 14 are selected by X-decoder 28 and Y-select driver circuit 10.

Turning now to the configuration of Y-select driver circuit 10, Y-select driver circuit 10 includes an N-channel device 46 having a gate 48, a source 50 connected to low voltage 52 (e.g., ground), and a drain 54 connected to Y-select line 24 (and, thus, to the gate of transistor 36). Y-select driver circuit 10 also includes a P-channel device 56 having a gate 58, a source 60, and a drain 62 connected to the drain 54 of N-channel device 46 and to Y-select line 24. The gates 48 and 58, respectively, of N-channel device 46 and P-channel device 56 are interconnected to receive the same voltage input 62.

A voltage supply ($V_{py}$) 64 is connected to the source 60 of P-channel device 56. In operation, the voltage supply switches between a high voltage (e.g., 11 volts) and a lower voltage (e.g., 5 volts). Microcode running in a microcontroller (not shown) controls the switching of voltage supply 64. A gate driver 66 supplies, to the gates of N-channel device 46 and P-channel device 56, a high voltage that matches voltage supply 64 or a low voltage (e.g., 0 volts). Gate driver 66 is also controlled by microcode running, e.g., in a microcontroller, and by address decoding (not shown)

Figure 3:
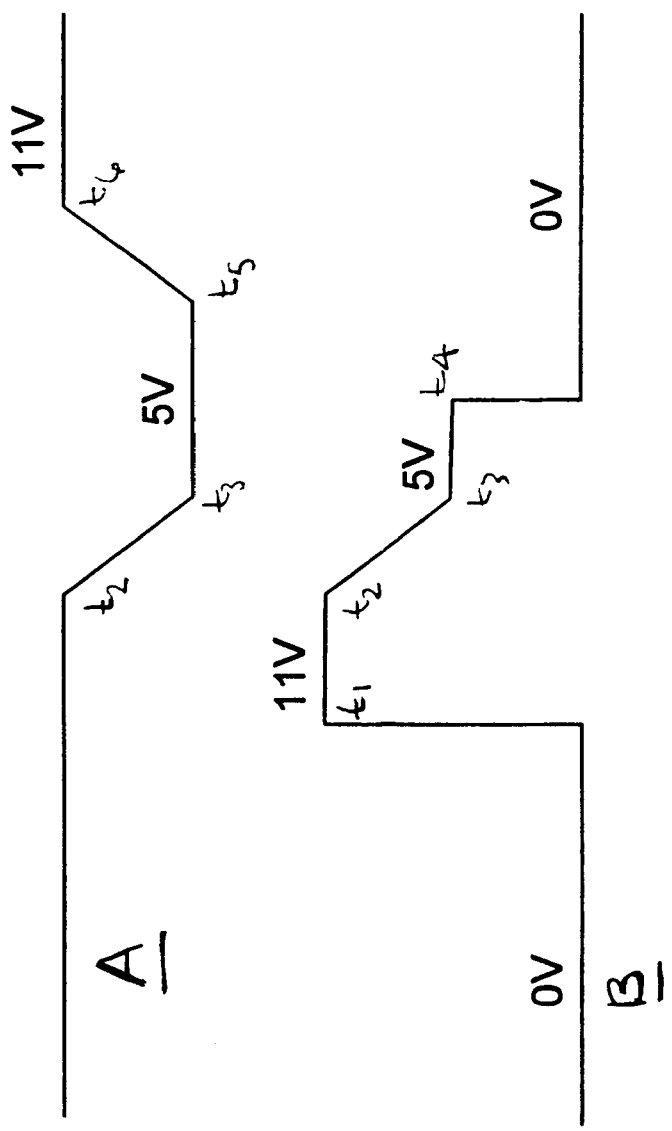
FIG. 3 includes graphs A and B, which show voltage levels applied to the Y-select driver circuit.

FIG. 3 shows graph "A" depicting the switching of voltage supply 64 and graph "B" depicting the corresponding voltage provided to Y-select driver circuit 10. As shown, prior to time $t_1$, a low voltage (0 volts) is applied to the gates of N-channel device 46 and P-channel device 56. This low voltage turns P-channel device 56 on, resulting in the voltage from voltage supply 64 (11 volts) at Y-select line 24 (since, when on, P-channel device 56 acts as a closed circuit). The low voltage at gate 48 causes N-channel device 46 to turn off (i.e., to act as an open circuit).

At time $t_2$, gate driver 66 ramps-down the voltage to gates 48 and 58 from a high voltage (11 volts) to an intermediary voltage (5 volts), which is reached at time $t_3$. At about the same time, voltage supply 64 also ramps down the voltage applied to the source 60 of P-channel device 56 from high voltage (11 volts) to a lower voltage (5 volts).

While voltage supply 64 is at the lower voltage (5 volts) (e.g., at time $t_4$), gate driver 66 raises the voltage at gates 48 and 58 to an intermediate voltage (5 volts). N-channel device 46 then begins conducting and P-channel device 56 turns off. At time $t_5$, voltage supply 64 begins ramping-up from the lower voltage (5 volts) to the high voltage (11 volts), which voltage supply 64 reaches at time $t_6$. The high voltage (11 volts) from voltage supply 64 is supplied to other Y-select lines (not shown).

Reducing the voltage at the source of the P-channel device reduces the voltage at junction 70 (FIG. 1), which is the drain of N-channel device 46. This, coupled with the gradual reduction in the gate voltage, reduces the amount of ionization current from the N-channel device that flows into the device's substrate. Thus, by controlling the voltages applied to gates 48 and 58 and source 60 of P-channel device 56, the likelihood of voltage snap-back is reduced (versus switching the N-channel device at high voltage (11 volts)).

The foregoing describes controlling voltages using microcode operating in a microcontroller of, e.g., a computer or other type of machine. Voltage control, however, is not limited to use with this hardware/software configuration.

Voltage control may be implemented in hardware, software, or a combination of the two. Voltage control may be implemented in computer programs executing on programmable computers or other machines that each include a processor, a storage medium readable by the processor (including volatile and non-volatile memory and/or storage components), at least one input device, and one or more output devices. Program code may be applied to data entered using an input device (e.g., a mouse or keyboard) to perform voltage control.

Each such program may be implemented in a high level procedural or object-oriented programming language to communicate with a computer system. However, the programs can be implemented in assembly or machine language. The language may be a compiled or an interpreted language.

Each computer program may be stored on a storage medium/article (e.g., CD-ROM, hard disk, or magnetic diskette) that is readable by a general or special purpose programmable computer for configuring and operating the computer when the storage medium or device is read by the computer to perform voltage control. Voltage control may also be implemented as a machine-readable storage medium, configured with a computer program, where, upon execution, instructions in the computer program cause a machine to operate appropriately.

The invention is not limited to the specific embodiments described above. For example, voltage supply 64 is not limited to providing voltages between 11 volts and 5 volts. Any voltage may be used, e.g., 12 volts to 3 volts, etc. Gate driver 66 is also not limited to providing 11 volts, 5 volts, or 0 volts, e.g., any appropriate voltages may be used. The high voltages applied to gates 48 and 58 and source 60 may be the same (as in the 11 volt example described above) or different. Similarly, the intermediary voltage from gate driver 66 may be the same as the lower voltage of voltage supply 64 (as in the 5 volt example described above) or different. The low voltages described above may be, but need not be, ground potential.

N-channel device 46 be a MOS (Metal Oxide Semiconductor) transistor or any other type of device that may suffer from snap-back upon voltage switching. P-channel device 56 may also be a MOS transistor or any other appropriate device.

The voltage switching technique and circuitry are described above in the context of a flash memory chip; however, they may be applied in the context of any circuitry where voltages are switched onto a line using the Y-select driver circuit configuration of FIG. 1.

Other embodiments not specifically described herein are also within the scope of the following claims.

What is claimed is:

1. A circuit comprising:
  a gate driver that supplies, to gates of N-channel and P-channel devices, a second high voltage, a second low voltage, or an intermediary voltage between the second high voltage and second low voltage, the gate driver supplying the intermediary voltage when a voltage supply connected to a source of the P-channel device switches between a first high voltage and a first lower voltage.

2. The circuit of claim 1, wherein:
  the N-channel device has a source connected to low voltage and a drain connected to a memory select gate;
  the P-channel device has a source and a drain connected to the drain of the N-channel device;
  the voltage supply is connected to the source of the P-channel device, the voltage supply switching between the first high voltage and the first lower voltage; and
  the circuit further comprises a memory cell having a storage device for storing charge, the memory cell being selectable via the memory select gate.

3. The circuit of claim 2, further comprising:
  a block of memory cells arranged in a Cartesian XY grid;
  wherein an individual cell in the block of memory cells is selectable via the memory select gate, the memory select gate comprising a Y-select coordinate in the Cartesian XY grid.

4. The circuit of claim 3, wherein the Y-select coordinate comprises a bit line select in the block of memory cells.

5. The circuit of claim 3, wherein the block of memory cells comprise a flash memory.

6. The circuit of claim 1, wherein the first high voltage and the second high voltage are the same.

7. The circuit of claim 1, wherein the first high voltage and the second high voltage are different.

8. The circuit of claim 1, wherein a low voltage is connected to a source of the N-channel device and the low voltage connected to the source of the N-channel device is ground.

9. The circuit of claim 1, wherein the N-channel device and the P-channel device are metal oxide semiconductor transistors.

10. The circuit of claim 1, wherein the gate of the N-channel device and the gate of the P-channel device receive a same voltage input from the gate driver.

11. A method of supplying voltage to a circuit, the method comprising:
  supplying, to gates of N-channel and P-channel devices, a second high voltage, a second low voltage, or an intermediary voltage between the second high voltage and second low voltage, the intermediary voltage being supplied when a voltage supplied to a source of the P-channel device switches between a first high voltage and a first lower voltage.

12. The method of claim 11, wherein the first high voltage and the second high voltage are the same.

13. The method of claim 11, wherein the first high voltage and the second high voltage are different.

14. The method of claim 11, wherein a low voltage is connected to a source of the N-channel device and the low voltage connected to the source of the N-channel device is ground.

15. The method of claim 11, wherein the N-channel device and the P-channel device are metal oxide semiconductor transistors.

16. The method of claim 11, wherein the gate of the N-channel device and the gate of the P-channel device receive a same voltage input.

17. An article comprising a machine-readable medium that stores instructions to control a supply of voltage to a circuit, the instructions causing a machine to:
  control supplying, to gates of N-channel and P-channel devices, a second high voltage, a second low voltage, or an intermediary voltage between the second high voltage and second low voltage, the intermediary voltage being supplied when a voltage supply switches between the first high voltage and first lower voltage.

18. The method of claim 17, wherein the first high voltage and the second high voltage are the same.

19. The method of claim 17, wherein the first high voltage and the second high voltage are different.

20. The method of claim 17, wherein a low voltage is connected to a source of the N channel device and the low voltage connected to the source of the N-channel device is ground.

21. The method of claim 17, wherein the N-channel device and the P-channel device are metal oxide semiconductor transistors.

22. The method of claim 17, wherein the gate of the N-channel device and the gate of the P-channel device receive a same voltage input.

23. A method of supplying voltage to a circuit that drives gates for selecting memory cells, the circuit comprising an N-channel device and a P-channel device connected to provide either high voltage or low voltage to the gates, the method comprising:

supplying a first voltage to gates of the N-channel device and the P-channel device to provide the high voltage to the gates;

supplying, after the first voltage, a second voltage to the gates of the N-channel device and the P-channel device during switching from the high voltage to the low voltage; and supplying, after the second voltage, a third voltage to the gates of the N-channel device and the P-channel device to provide the low voltage to the gates;

wherein the first voltage is higher than the second voltage and the second voltage is higher than the third voltage.

24. The method of claim 23, wherein the second voltage includes a ramp-down phase.

25. The method of claim 23, wherein the first voltage is the same as the high voltage and the second voltage is the same as the low voltage.

* * * * *